(12) United States Patent
Grodzki

(10) Patent No.: US 9,933,504 B2
(45) Date of Patent: Apr. 3, 2018

(54) METHOD AND MAGNETIC RESONANCE APPARATUS TO DETERMINE A MAGNETIC RESONANCE IMAGE FROM MAGNETIC RESONANCE DATA

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 608 days.

(21) Appl. No.: 14/526,999

(22) Filed: Oct. 29, 2014

(65) Prior Publication Data

US 2015/0115959 A1 Apr. 30, 2015

(30) Foreign Application Priority Data

Oct. 29, 2013 (DE) ........................ 10 2013 221 940

(51) Int. Cl.
*G01R 33/56* (2006.01)
*G01R 33/565* (2006.01)
*G01R 33/28* (2006.01)
*G01R 33/48* (2006.01)

(52) U.S. Cl.
CPC .......... *G01R 33/565* (2013.01); *G01R 33/28* (2013.01); *G01R 33/4818* (2013.01); *G01R 33/56536* (2013.01); *G01R 33/56563* (2013.01); *G01R 33/56572* (2013.01)

(58) Field of Classification Search
CPC .. G01R 33/565; G01R 33/28; G01R 33/4818; G01R 33/56536; G01R 33/56563; G01R 33/56572
See application file for complete search history.

(56) References Cited

U.S. PATENT DOCUMENTS

| 2004/0032261 | A1 | 2/2004 | Schweikard et al. |
| 2005/0001619 | A1* | 1/2005 | Kiefer ............... G01R 33/56563 324/309 |
| 2011/0210735 | A1* | 9/2011 | Trakic ................ G01R 33/5659 324/309 |
| 2012/0235679 | A1* | 9/2012 | Xue .................. G01R 33/56509 324/307 |

(Continued)

OTHER PUBLICATIONS

"Metal-Induced Artifacts in MRI," Hargreaves et al., AJR, vol. 197 (2011), pp. 547-555.

(Continued)

*Primary Examiner* — Clayton E Laballe
*Assistant Examiner* — Ruifeng Pu
(74) *Attorney, Agent, or Firm* — Schiff Hardin LLP

(57) ABSTRACT

In a method and apparatus to determine a magnetic resonance image from magnetic resonance data entered into k-space that are acquired with the magnetic resonance apparatus, in the acquisition of the data a deviation from ideal homogeneity, described by an interference field, is present in the imaging region that is covered by the magnetic resonance data. To reduce image artifacts generated by this interference field, the transformation of the magnetic resonance data from k-space into the image domain, at least along a readout direction of a readout gradient used in the acquisition, takes place by multiplication of the data with the inverse of a transformation matrix that is calculated depending on the interference field.

12 Claims, 2 Drawing Sheets

(56) References Cited

U.S. PATENT DOCUMENTS

2013/0099784 A1\* 4/2013 Setsompop ............ G01R 33/54
324/309
2016/0327624 A1\* 11/2016 O'Brien ............. G01R 33/5608

OTHER PUBLICATIONS

"Fast approximate solution of Bloch equation for simulation of RF artifacts in Magnetic Resonance Imaging," Balac et al., Mathematical and Computer Modelling, vol. 48 (2008), pp. 1901-1913.

\* cited by examiner

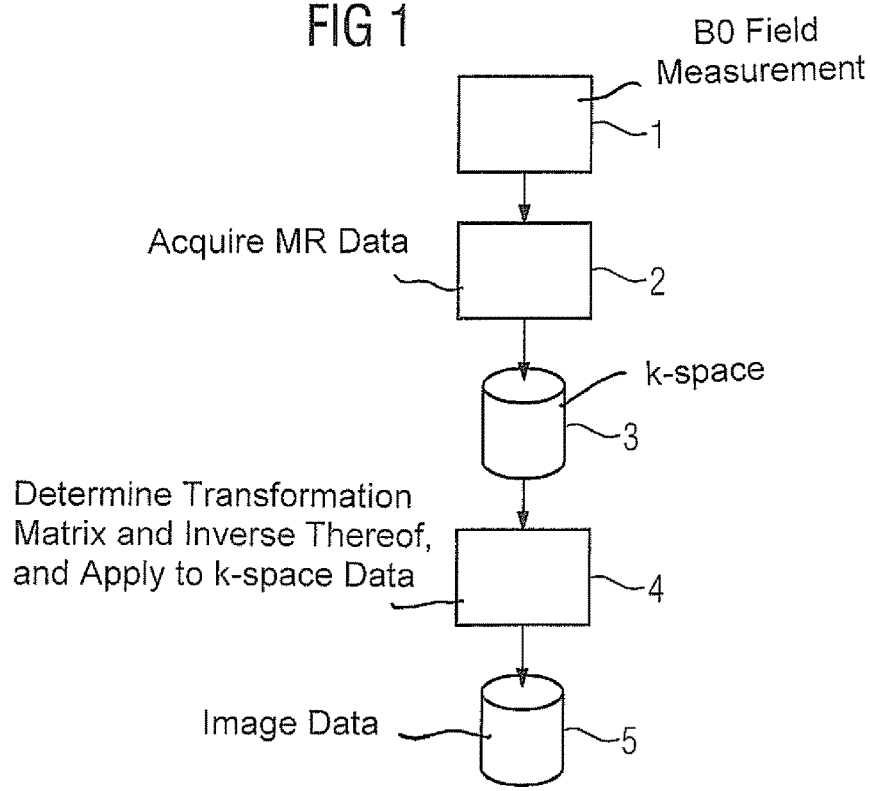
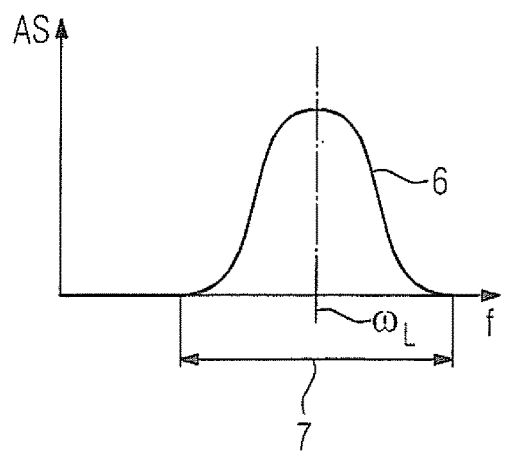

METHOD AND MAGNETIC RESONANCE APPARATUS TO DETERMINE A MAGNETIC RESONANCE IMAGE FROM MAGNETIC RESONANCE DATA

BACKGROUND OF THE INVENTION

Field of the Invention

The invention concerns a method to determine a magnetic resonance image from magnetic resonance data entered into k-space that are acquired with a magnetic resonance apparatus, wherein, in the acquisition, a deviation (described by an interference field) from ideal homogeneity is present in the imaging region covered by the magnetic resonance data. The invention concerns a magnetic resonance apparatus to implement such a method.

Description of the Prior Art

In magnetic resonance imaging (often also called magnetic resonance tomography), a basic field magnet of a magnetic resonance apparatus generates a homogeneous basic magnetic field (most often designated as B0). For example, the basic magnetic field can have a strength of 1.5 or 3 T. In a defined region (known as the homogeneity region) around the isocenter of the basic magnet, accuracies with deviations in the ppm range are achieved. To excite nuclear spins in a subject for magnetic resonance imaging, the basic magnetic field is superimposed with an excitation magnetic field (known as the B1 field) aligned orthogonal to the basic magnetic field that is weaker by five to six times orders of magnitude than the basic magnetic field. The B1 field or excitation magnetic field is generated by radio-frequency coils based on an excitation pulse that is part of the magnetic resonance sequence to acquire magnetic resonance data. Additionally, in magnetic resonance imaging magnetic field gradients are used that have a linear curve in the homogeneity region of the basic magnetic field and that are smaller by two to three orders of magnitude than the basic magnetic field. With the use of such gradient fields, the frequency and the phase of the signals produced by the excited nuclear spins are coded so that ultimately a path in k-space is defined along which the magnetic resonance data are entered into k-space. The magnetic resonance data in k-space must then be transferred into the image domain (i.e., image data that can be displayed).

It has long been the state of the art to apply a Fourier transformation in order to transform the magnetic resonance data from k-space into the image domain, and thus to obtain magnetic resonance images that show the imaging region in spatial coordinates.

In practice, the homogeneity of the basic magnetic field in the homogeneity region and the linearity of the gradient fields can be negatively affected by interference fields. For example, interference fields can be created by imperfections in the gradient system or by induced magnetic fields in the examined subject. Implants, dental braces and the like in the patient as a subject to be examined can be responsible for this. These interference fields generally lead to artifacts in the magnetic resonance image (known as susceptibility artifacts) since the frequency coding and phase coding of the spins is disrupted and signals are either lost due to dephasings or are rendered with distortion in the image. Due to the interference field, it may occur that spins in a curved slice of the subject are excited, rather than a rectilinear slice as intended. Artifacts also arise in this manner outside of the homogeneity region, wherein the fields do not have a linear or homogeneous curve.

For metal-induced artifacts in the overall problem in magnetic resonance imaging is described in summary in an article by Brian A. Hargreaves at al., "Metal-Induced Artifacts in MRI", AJR:197, Page 547-555, September 2011.

Various approaches are known in order to keep the influence of the interference fields on the magnetic resonance image as small as possible. As described in the cited article, in one approach the dephasing and distortion during the data acquisition can be kept as minimal as possible by suitable sequence parameters, such as high readout pulse bandwidth. In another approach, after the Fourier transformation the distortion can be corrected in the image domain. Correction in the image domain is only reasonable for small disruptions since, due to the superposition of multiple image points a calculation can no longer be made as to which signal intensity originates from which original image point. Variations in the measurement protocol or in the magnetic resonance sequence are difficult to reconcile and must be made for each subject to be acquired.

SUMMARY OF THE INVENTION

An object of the invention is to provide a method that is improved relative to conventional approaches for reduction of artifacts caused by interference fields. Such a method should preferably be integrated into the reconstruction process of the magnetic resonance images.

This object is achieved in a method of the aforementioned type but wherein, according to the invention, in order to reduce artifacts generated by an interference field, the transformation of the magnetic resonance data from k-space into the image domain takes place at least along one readout direction of a readout gradient used in the acquisition by a multiplication with the inverse of a transformation matrix that depends on the interference field.

The invention thus deviates from the conventional tenet that reconstruction of the magnetic resonance image in image form must take place through a Fourier transformation, and the invention is thereby able to take into account the influence of the interference field in at least one spatial direction (preferably at least the readout direction), through the use of the inverse of a calculable transformation matrix. In this way, the influence of interference fields can already be corrected (or at least markedly reduced) in k-space. The necessary information about the interference field and the influence on the measured magnetic resonance signal (thus the measured magnetic resonance data) is already included in the elements of the transformation matrix. The influences of the interference field can thus already be corrected (or at least markedly reduced) in the calculation of the magnetic resonance image. In this way, no changes are necessary in the measurement protocol or in the magnetic resonance sequence. The method according to the invention also allows the correction of artifacts that could previously not be corrected.

While the approach according to the invention—to derive a calculable transformation matrix under full consideration of the interference field, and to use its inverse for the transformation of the magnetic resonance data from k-space into the image domain—can lead to a complete correction of all effects of the interference field, in practice the artifacts can still not be entirely avoided with such a method, because only spins in a defined sequence range that is described by the spectrum of the excitation pulse are excited in the RF excitation (thus the excitation pulse) used in the magnetic resonance sequence. This means that, in the immediate proximity of an interference source (an implant, for example), the magnetic field interference can be so strong that the Larmor frequency notably shifts, and nuclear spins in such a sub-region are no longer excited, so that they contribute no signal in the image. In that case, the method according to the invention nevertheless delivers a markedly improved image quality, consequently a marked reduction of artifacts even in practical cases.

The transformation matrix thereby results under consideration of the interference field by the phase based on a Fourier transformation yielding the magnetic resonance data from the measured spin density distribution without interference fields, and discretization of the image domain and k-space. This means that the elements of the transformation matrix can be derived analytically and can be calculated easily, such that the inversion of the transformation matrix follows as a primary calculation task arising within the scope of the present invention. The corresponding mathematical procedure is outlined briefly in the following.

For simpler presentation, the mathematical derivation is presented for a direction (here the x-direction) that corresponds to the readout direction; it proceeds analogously for the other directions, as should then also briefly be presented. If $A(x)$ designates the spin density distribution (to be measured and ultimately to be presented in the magnetic resonance image) in the subject depending on the position in the x-direction, and $k_x$ designates the value associated with the x-direction in k-space, and $S(k_x)$ designates the magnetic resonance data to be measured in the case without distortion, then $$S(k_x) = \int_x A(x)e^{ik_x x} dx \qquad (1)$$

results in continuous notation (thus a typical Fourier transformation), wherein the phase $\Phi$ here simply results as $$\Phi(k_x, x) = k_x x.$$

However, in the presence of interference fields (which naturally are themselves spatially dependent on x or in general), $$\tilde{S}(k_x) = \int_x A(x)e^{i(k_x x + \gamma \delta B \cdot t)} dx \qquad (2)$$

results for the distorted magnetic resonance data wherein t designates the point in time at which the corresponding k-space point $k_x$ is measured, such that $t=t(k_x)$. A phase including the interference field can consequently be defined as $$\Phi^*(k_x, x) = k_x x + \gamma \delta B(x) t(k_x). \qquad (3)$$

In magnetic resonance imaging, discrete points in k-space are measured, which consequently also applies to positional space, such that the Formula (1) can be written as $$S_{k_x} = \sum_x A(x)e^{ik_x x}, \qquad (4)$$

and $$\tilde{S}_{k_x} = \sum_x A(x)e^{i\Phi^*} \qquad (5)$$

analogously results from the Formula (2) with the definition (3).

Equation (5) can be written as a matrix equation $$\tilde{S}_k = D_{kx} A_x, \qquad (6)$$

in which it applies that:

$$A_x = A(x), \quad D_{kx} = e^{i\Phi^*}. \qquad (7)$$

For better legibility, $k_x$ has simply been written as k.

At this point, two determinations are to be made. The matrix elements $D_{kx}$ of the matrix $D^{(x)}$ can be calculated if the interference field is known, and additionally the time curve that, however, follows from the magnetic resonance sequence itself. However, on the other hand $\tilde{S}$ precisely describe the magnetic resonance data that are measured; A describes the sought magnetic resonance image in image space so that the matrix equation (6) can be inverted in order to calculate the magnetic resonance image A (consequently the spin density distribution) in image space as $$A = (D^{(x)})^{-1} \tilde{S}. \qquad (8)$$

The general formula for multiple spatial directions in the general example of a slice image acquisition with slice selection direction z and phase coding direction y thus is $$S(k_x, k_y) = \iint A(x, y) e^{i(k_x x - k_y y)} dx dy, \qquad (9)$$

Referencing the formula for undisturbed k-space that was initially cited; it is apparent that the derivation of transformation matrices can easily be extended to the remaining spatial directions.

However, the inverse of the transformation matrix is applied only in the readout direction, although the transformation of k-space into image space takes place as Fourier transformations in directions not calculated using a transformation matrix, which means that the conventional method of Fourier back-transformation is used in the phase coding direction or phase coding directions. In this way, an accelerated calculation is possible since only a similar phase shift results in the phase coding direction due to the interference field; a constant phase is consequently to be inserted. At least given absolute value images, a limitation of the matrix inversion to the readout direction is consequently possible without problems since an interference field only generates an additional phase in the phase coding direction in such magnetic resonance images. However, if the phase is relevant—for example when phase magnetic resonance images are considered—it is proposed to also calculate, invert and apply the transformation matrix in the phase coding direction.

It is also conceivable in the method according to the invention for transformation matrices to be used for all directions in the image domain; transformation matrices thus can consequently also be determined, inverted and applied for phase coding directions.

One requirement for the method according to the invention is an optimally precise knowledge of the interference field in order to be able to calculate the elements of the transformation matrix. However, methods to determine interference fields are widely known because B0 measurements (in particular to determine a B0 field map) are often implemented in the prior art. This means that the interference field can also be determined from a B0 measurement within the scope of the present invention. Arbitrary possibilities for B0 mapping or B0 measurement from the prior art can be used.

In an embodiment of the present invention before applying the transformation matrix, the transformation matrix is supplemented by a selection function that describes the excitation of spins at various locations in the imaging region and is determined from the spectrum of the excitation pulse and the known spatially dependent interference field. As presented above, a particularly strong interference field can lead to the situation that the Larmor frequency of spins shifts so much that spins are no longer excited at all by the excitation pulse. This can be considered for additional improvement of the quality of the magnetic resonance in the method according to the invention, for example in that the matrix elements of the transformation matrix are applied, multiplied with a selection function that takes this circumstance into account, wherein the selection function supplies a value of zero for all spins that are not described by the excitation pulse. Because the excitation pulse is known, through the spectrum it is also known which spins it affects and can still be excited, wherein at the same time the interference field indicates how strongly the Larmor frequencies of spins are shifted at different locations. From this combined knowledge, it can be determined whether an excitation for a defined, discretized spatial point (consequently an image point) will occur at all, or how strong this excitation will turn out to be. This is mapped via the selection function. For example, if the matrix elements $D_{kx}$ derived above are considered, the matrix elements can accordingly be modified as $$D_{kx} \rightarrow c(x) D_{kx}, \qquad (10)$$

wherein $c(x)$ is the selection function.

In an embodiment, the selection function is formed by at least one Heaviside function using the spectral width of the excitation pulse. In this case, simple image points with spins that lie outside of the excited frequency range are removed from consideration because the signal intensity is assumed to be zero. Other image points continue to be fully considered.

In another embodiment, the selection function describes an excitation strength at the various locations that is in particular normalized to values between zero and one, consequently concretely at the different image points. If the spectral properties of the excitation pulse are known, it can also be determined therefrom how strongly the excitation turns out to be relative to the maximum possible excitation at the nominal Larmor frequency of the magnetic resonance device, and the contribution of the less excited spins can also be given less consideration in this manner.

In addition to the method, the present invention also concerns a magnetic resonance device having a control apparatus designed to implement the method according to the invention. All statements with regard to the method according to the invention apply analogously to the magnetic resonance apparatus according to the invention, as do cited advantages that are achieved. In particular, the method according to the invention can be fully integrated into the typical evaluation process of magnetic resonance data, such that a fully automatic correction of artifacts caused by interference fields takes place, which according to the invention occurs during the reconstruction of the magnetic resonance image.

The present invention also encompasses a non-transitory, computer-readable data storage medium encoded with programming instructions that, when the storage medium is loaded into a computerized control unit or processor of a magnetic resonance apparatus, cause the control unit or processor to execute any or all embodiments of the method described above. The storage medium, for example, can be a CD-ROM.

BRIEF DESCRIPTION OF THE DRAWINGS

FIG. 1 is a flowchart of an embodiment of the method to the invention.

FIG. 2 shows an excitation pulse of an excitation pulse suitable for use in accordance with the invention.

DESCRIPTION OF THE PREFERRED EMBODIMENTS

Figure 3:
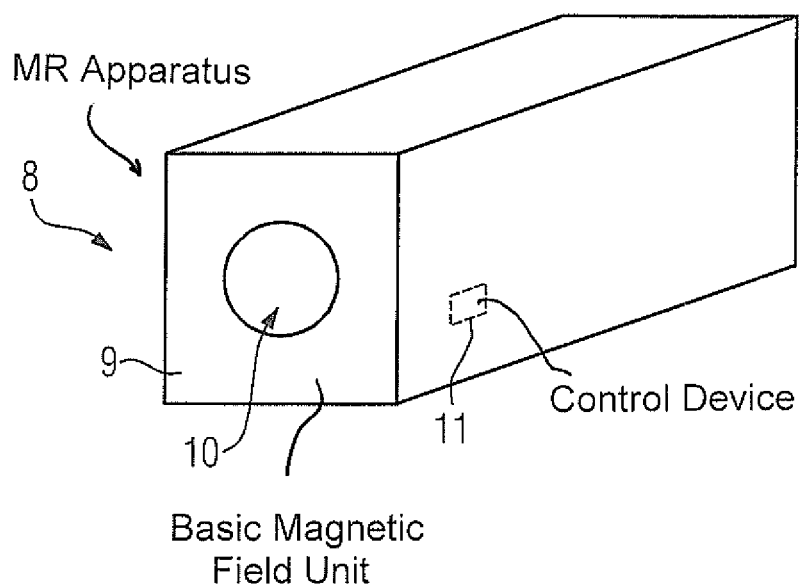
FIG. 3 schematically illustrates a magnetic resonance device according to the invention.

FIG. 1 shows a flowchart of basic step in the method according to the invention with which a magnetic resonance image in the image domain can be derived in a modified manner from magnetic resonance data entered into k-space, such that artifacts generated by interference fields are reduced.

For this purpose, a B0 field measurement is initially implemented in Step 1 with the subject to be acquired already located in an imaging position within the magnetic resonance apparatus. Such B0 field measurements are most often implemented anyway and deliver as a result a B0 map that, for example, shows deviations from the nominal Larmor frequency of the magnetic resonance device. From these, field deviations from the nominal basic magnetic field of the magnetic resonance device can easily be determined, consequently the presence of the interference field that can arise due to imperfections of the magnetic resonance device and interference sources specific to the subject to be acquired or, respectively, the current acquisition situation (for example due to implants and the like).

In Step 2, magnetic resonance data 3 that are entered into present in k-space are then acquired with a defined magnetic resonance sequence. From the magnetic resonance sequence, it is also known when each point in k-space has been scanned, which means at which point in time each magnetic resonance data entry was acquired in a slice image acquisition, characterized by values of $k_x$ and $k_y$ (k-space coordinate axes).

In order to produce a magnetic resonance image, the magnetic resonance data must be transformed from k-space into the image domain. This occurs in Step 4 by matrix elements of a transformation matrix being determined for the readout direction (here the x-direction), and the inverse of this transformation matrix is then applied to the magnetic resonance data with regard to the readout direction. This thereby proceeds according to the formulas (7), (3) and (8).

In the phase coding direction (here the y-direction), a typical Fourier transformation is applied because it is not a phase image that should be obtained as a magnetic resonance image 5, but rather an absolute value image.

The magnetic resonance image 5 has markedly fewer artifacts than would occur with the use solely of the typical Fourier transformation, and (for example) can be presented at a display device of the magnetic resonance apparatus.

The matrix elements that are determined in Step 5 are preferably also multiplied with a selection function $c(x)$ according to formula (10). This selection function $c(x)$ designates whether or how strongly the spins at the considered image point have been excited. For this purpose, an excitation profile 6 (consequently a spectrum) of the excitation pulse that is used can be considered, which is fundamentally known from the data of the magnetic resonance sequence. The excitation strength AS is plotted against the frequency f. The excitation profile clearly reaches its maximum at the Larmor frequency $\omega_L$, at which a certain spectral width is present, which means that an excited frequency range 7 exists in which a possibly reduced excitation of the spins still takes place. However, because the interference field (and consequently the local variation of the Larmor frequency) is now known, how strongly the spins are excited within that range, or whether they are excited at all, can be determined from the combination of the known data for the interference field and the excitation profile 5 for each image point in image space. The selection function c(x) is zero if no excitation of spins takes place whatsoever, and otherwise can amount to one everywhere or can scale between zero and one with the excitation strength.

FIG. 3 is a schematic illustration of a magnetic resonance apparatus 8 according to the invention that—as is basically known—has a basic magnetic field unit 9 with the basic magnet that generates the basic magnetic field B0 within a patient receptacle 10 defined by the basic magnetic field unit 9 (concretely, in the homogeneity region there). A radio-frequency coil arrangement (not shown in detail) and a gradient coil arrangement (likewise not shown in detail) are typically provided surrounding the patient receptacle 10, via which radio-frequency coil arrangement and gradient coil arrangement excitation pulses and other radio-frequency pulses or gradient pulses can be output.

The operation of the magnetic resonance device 8 is controlled by a control device 11 that is designed to implement the method according to the invention, consequently with a control unit to control the remaining components of the magnetic resonance device to realize a magnetic resonance sequence, and a reconstruction unit in which magnetic resonance data present in k-space can be translated into a magnetic resonance image. For this purpose, the reconstruction unit can have a transformation matrix determination sub-unit that determines the transformation matrix and in which the transformation matrix is then inverted.

The control device 11 also serves as a computer to execute the programming instructions stored on the non-transitory storage medium according to the invention.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate a magnetic resonance image from magnetic resonance data entered into k-space in a data acquisition procedure executed by a magnetic resonance apparatus in which a basic magnetic field is present in an imaging region from which the magnetic resonance data were acquired, the basic magnetic field deviating from ideal homogeneity in the imaging region by a deviation described by an interference field, and wherein the magnetic resonance data entered into k-space are acquired along a readout direction defined by a read out gradient generated in the magnetic resonance apparatus, said method comprising:

in a computer having access to said data entered into k-space, calculating a transformation matrix dependent on said interference field and generating an inverse transformation matrix that is the inverse of said transformation matrix;

in said computer, transforming said magnetic resonance data entered into k-space into the image domain, as image data, by multiplying at least said magnetic resonance data entered into k-space along said readout direction by said inverse transformation matrix; and making said image data available in electronic form at an output of said computer, in a format allowing display of an image represented by said image data.

2. A method as claimed in claim 1 comprising, in said computer, calculating said transformation matrix dependent on said interference field based on a Fourier transformation of said magnetic resonance data from a measured spin density distribution, without said interference field, and discretization of the image domain and k-space.

3. A method as claimed in claim 1 comprising implementing said Fourier transformation in said computer in directions that were not used to calculate said transformation matrix.

4. A method as claimed in claim 1 comprising generating a transformation matrix for each spatial direction in the image domain.

5. A method as claimed in claim 1 comprising determining said interference field by implementing a B0 measurement of said basic magnetic field.

6. A method as claimed in claim 1 comprising, in said computer, supplementing said transformation matrix with a selection function before multiplying said data in k-space with said transformation matrix, said selection function describing an excitation of nuclear spins at different locations in said imaging region, determined from a spectrum of an excitation pulse used to excite said spins in said procedure, and said interference field.

7. A method as claimed in claim 6 comprising employing a selection function that has a value of 0 for all spins that are not defined by said excitation pulse.

8. A method as claimed in claim 6 comprising using a selection function formed by at least one heavy side Heaviside function using a spectral width of an excitation pulse used to excite nuclear spins in said procedure.

9. A method as claimed in claim 6 comprising forming said selection function to describe an excitation strength of nuclear spins at different locations.

10. A method as claimed in claim 9 comprising normalizing said excitation strength to values between 0 and 1.

11. A magnetic resonance apparatus comprising:

a magnetic resonance data acquisition unit in which a basic magnetic field is present in an imaging region, the basic magnetic field deviating from ideal homogeneity in the imaging region by a deviation described by an interference field;

a control unit configured to operate the magnetic resonance data acquisition unit to acquire magnetic resonance data from said imaging region according to a data acquisition procedure, and to enter the acquired magnetic resonance data into k-space along a readout direction defined by a read out gradient generated in the magnetic resonance data acquisition unit;

a computer having access to said data entered into k-space configured to calculate a transformation matrix dependent on said interference field and to generate an inverse transformation matrix that is the inverse of said transformation matrix;

said computer being configured to transform said magnetic resonance data entered into k-space into the image domain, as image data, by multiplying at least said magnetic resonance data entered into k-space along said readout direction by said inverse transformation matrix; and said computer being configured to make said image data available in electronic form at an output of said computer, in a format allowing display of an image represented by said image data.

12. A non-transitory, computer-readable data storage medium encoded with programming instructions said storage medium being loaded into a computer of a magnetic resonance apparatus in which a basic magnetic field is present in an imaging region, the basic magnetic field deviating from ideal homogeneity in the imaging region by a deviation described by an interference field, said programming instructions causing said computer to:

operate the magnetic resonance apparatus to acquire magnetic data from the imaging region in a data acquisition procedure, and to enter the acquired magnetic resonance data entered into k-space are acquired along a readout direction defined by a read out gradient generated in the magnetic resonance apparatus;

calculate a transformation matrix dependent on said interference field and generate an inverse transformation matrix that is the inverse of said transformation matrix;

transform said magnetic resonance data entered into k-space into the image domain, as image data, by multiplying at least said MR data entered into k-space along said readout direction by said inverse transformation matrix; and make said image data available in electronic form at an output of said computer, in a format allowing display of an image represented by said image data.

* * * * *